United States Patent [19]

Heinz et al.

[11] Patent Number: 5,294,289

[45] Date of Patent: Mar. 15, 1994

[54] DETECTION OF INTERFACES WITH ATOMIC RESOLUTION DURING MATERIAL PROCESSING BY OPTICAL SECOND HARMONIC GENERATION

[75] Inventors: Tony F. Heinz, Chappaqua; Gary S. Selwyn; Syothi Singh, both of Hopewell Junction; John A. Spinetti, Jr., Endicott, all of N.Y.

[73] Assignee: International Business Machines Corporation, Armonk, N.Y.

[21] Appl. No.: 903

[22] Filed: Jan. 6, 1993

Related U.S. Application Data

[63] Continuation of Ser. No. 605,906, Oct. 30, 1990, abandoned.

[51] Int. Cl.$^5$ ............................................. H01L 21/00
[52] U.S. Cl. ................................. 156/626; 156/62 F; 156/345; 156/643; 427/10; 118/712
[58] Field of Search ............... 156/345, 643, 627, 626; 118/712; 427/10

[56] References Cited

U.S. PATENT DOCUMENTS

| | | | |
|---|---|---|---|
| 4,496,900 | 1/1985 | DiStefano et al. | |
| 4,562,089 | 12/1985 | Hieber et al. | |
| 4,713,140 | 12/1987 | Tien | |
| 4,837,044 | 6/1989 | Murarka et al. | 427/10 |
| 4,927,485 | 5/1990 | Cheng et al. | 156/626 |

FOREIGN PATENT DOCUMENTS 59-003925  1/1984  Japan.

OTHER PUBLICATIONS

"Understanding Lasers", by Jeff Hecht; ©1988, (Radio Shack); USA.
"Optical Second-Harmonic Generation From Semi Conductor Surfaces"; T. F. Heinz et al,; Advances in Laser Science III, American Institute of Physics, New York, 1988, p. 452.
"Nonlinear Optics of Surfaces and Adsorbates", Thesis; Univ. of California, Berkley; Nov. 1982; T. F. Heinz.
"Surface Studies by Second Order Harmonic Generation": The Absorption of $O_2$, CO and Sodium on Rh(]]]) Surface; Physical Review Letters; vol. 52, No. 5, Jan. 1984, American Physical Society, pp. 348–351; H. W. K. Tom et al.
"Study of Si(111) Surfaces by Optical Second-Harmonic Generation": Reconstruction and Surface Phase Transformation: Physical Review Letters; vol. 54, No. 1, Jan. 1985; American Physical Society; pp. 63–66; T. F. Heinz et al.
"Study of Symmetry and Disordering of Si(111)-7X7 surfaces by Optical Second Harmonic Operation"; J. Vac. Sci. Technol., B3(5) Sep./Oct. 1985; T. F. Heinz et al.
"Nonlinear Optical Study of Si Epitaxy"; Mat. Res. Soc. Symp. Proc; vol. 75, 1987; T. F. Heinz et al.
"Electronic Transitions at the $CaF_2$/Si(111) Interface Probed by Resonant Three-Wave-Mixing Spectroscopy:" Physical Review Letters; vol. 63, No. 6, Aug. 7, 1989; T. F. Heinz et al.
"Surface Studies with Optical Second-Harmonic Generation"; Trends in Analytic Chemistry; 8, 235 (1985); T. F. Heinz et al.
"Surface Optical Reflectance Process Monitor"; IBM T.D.B.; vol. 19; No. 12; May 1977; C. J. Kircher et al.
"Ellipsometric Method of Measuring the Height of Steps in Wafer Surfaces:" IBM T.D.B. vol. 21; No. 3; Aug. 1978; M. Briska et al.
"Method for of Determining Thickness of Polymer Contamination on Si After $CF_4/H_2$"; IBM T.D.B. vol. 28; No. 3; Aug. 1985; G. S. Oehrlein.
"High Ideality Schottky Barrier Diodes;" IBM T.D.B. vol. 20; No. 9; Feb. 1990; J. J. Gniewek et al.

Primary Examiner—Brian E. Hearn
Assistant Examiner—George A. Goudreau
Attorney, Agent, or Firm—Whitham & Marhoefer

[57] ABSTRACT

A technique for observing optical second harmonic generation effect at a surface of a material during processing thereof, particularly in the presence of a plasma, for controlling the processing of the material. A preferred form of the apparatus and method includes a combination of spectral, spatial, polarization and temporal filtering to allow observation of optical second harmonic generation and control of processing of the material with processes such as reactive ion etching to a high degree of resolution.

20 Claims, 2 Drawing Sheets

DETECTION OF INTERFACES WITH ATOMIC RESOLUTION DURING MATERIAL PROCESSING BY OPTICAL SECOND HARMONIC GENERATION

This application is a continuation of application Ser. No. 07/605,906, filed Oct. 30, 1990; now abandoned.

BACKGROUND OF THE INVENTION

1. Field of the Invention

The present invention generally relates to optical measurement techniques and, more particularly, to the detection of boundaries and thicknesses with very high resolution, especially in controlling manufacturing processes of material deposition, removal, and reaction and, most particularly, in the fabrication of integrated circuits.

2. Description of the Prior Art

Modern electronic, opto-electronic devices and the like are complex structures formed by many repeated steps of material deposition, reaction, modification (e.g. annealing), and removal. These processes are common to the fabrication of individual devices, integrated circuits and magnetic recording media (such as surfaces formed by sputtering) and apparatus. While typical dimensions of lateral features in such applications are frequently in the range of one micron, the thickness of layers is often far smaller than this scale, sometimes down to the range of 100 Angstroms. A thickness of 100 Angstroms corresponds to only some 50 atomic layers. It can be easily understood that precise measurement of the dimensions during processing is crucial to device performance and to the yield of the manufacturing process.

One of the critical general issues is the detection of a boundary during the removal of material. Material removal may occur by methods such as chemical etching or by a plasma process such as reactive ion etching. It is generally necessary to determine the time at which all of the desired material has been removed, but the underlying layer has not been etched significantly. This constitutes the so-called detection of endpoints. The etched material and the underlying material are frequently made of different compositions, such as silicon dioxide on a silicon layer. They may, however, differ primarily in their crystalline structure or doping level and not in their gross chemical composition. This poses particular challenges for the problem of endpoint detection. For example, in the manufacture of bipolar transistors the step of emitter opening involves etching an area of a deposited layer of polycrystalline silicon down to an epitaxial (single crystal) layer. This operation is typically performed by reactive ion etching which does not present any obvious means for real-time control. The consequences of improper etching are, however, significant. Underetching will cause a degradation of the gain of the transistor, while overetching will result in a degraded contact between the intrinsic and extrinsic base regions.

While some etching processes may provide selective removal of the overlayer and a slow rate of removal of the underlying material, this is not always attainable in practice. A real manufacturing process has numerous constraints, such as obtaining high etch rates and using relatively safe chemicals. The step may also require a strongly anisotropic etch rate. These conditions collectively mean that a highly selective etch may not be available. In this instance, the capability of monitoring the progress of the etching process during manufacturing becomes of critical importance.

A related issue is the determination of the thickness of layers of finite dimensions. This may be of relevance either in removing material to obtain a layer of a given thickness or in depositing material until a layer of a given thickness is reached. To cite one example, consider the gate insulator in a field effect transistor. The thickness of the insulating region will affect the switching voltage and the uniformity of the thickness will affect the uniformity of performance of transistors in an integrated circuit. The thickness of a layer formed by the reaction of two materials is also a quantity of interest. Examples of this situation occur in the formation of a silicon oxide layer by a chemical reaction with gas species containing oxygen and in the formation of a metal silicide on a silicon surface, an important process for forming contacts in semiconductor devices.

It should be noted that some reactions and modifications of surfaces will occur spontaneously such as oxidation of silicon at room temperature in the presence of oxygen and the formation of silicides. However, such spontaneous reactions typically will only occur to a small depth which is trivial for purposes of fabrication of any useful device. However, such processes can be made to continue in a controllable manner by imposing appropriate conditions such as high temperature. Accordingly, by reference herein to controllable surface reactions and modifications, it is intended to exclude reactions and modifications which occur spontaneously at relatively low temperatures and are not controllable in the sense in which a manufacturing process may be controlled.

Many techniques have been developed for examining the thickness and other properties of thin layers subsequent to processing. One of the important techniques for post-processing analysis is secondary ion mass spectrometry. This process involves detection of the material by mass spectrometric means as it is sputtered by an impinging ion beam. Although providing important and precise information on chemical composition and thicknesses of layers, this technique is destructive, since it destroys the sample under investigation. It is also not suitable for in-situ measurements even if its destructive character could be tolerated. Similar considerations apply for electron microscopy and direct mechanical measurements which are other familiar approaches for post-processing analysis. Other methods appropriate for surface analysis may give very high sensitivity. These include electron diffraction techniques (LEED and RHEED), electron energy loss spectroscopy, Auger electron spectroscopy, photoelectron spectroscopy, and so forth. These latter methods are, however, all restricted to high vacuum environments and cannot be used under realistic processing conditions.

It should be noted that all techniques which are not adaptable to in-situ process monitoring and destructive testing techniques, in particular, rely on trial-and-error development of an appropriate process and the repeatability of the process itself to form the desired structures. The trial-and-error process development increases cost of the process and reliance on repeatability reduces yield, particularly in devices in which endpoints and thicknesses are critical.

Non-destructive techniques for real-time, in-situ, analysis in processing environments are far fewer than those summarized above. Non-destructive techniques are typically optical, although in some cases electrical measurements may be appropriate, depending on the processing environment.

Electrical techniques usually depend on the measurement of the electrical resistance or the voltage dependence of the electrical resistance determined by passing a current through the layer either in a direction parallel or perpendicular to the surface layer. The analysis of such measurements may be quite complex, since the observed resistance depends on a variety of factors in addition to the layer thickness, such as the width of the layer, the influence of underlying structures, and the material properties. The measurements may also be strongly affected by factors such as the contact resistance and are clearly limited in application to materials with reasonable electrical conductively. Refinements in these techniques are capable of detecting slight nonlinearities in the relation between applied voltage and the induced current, that is, a voltage-dependent effective resistance. These approaches are particularly useful for identifying material defects, but do not necessarily improve the method for detecting boundaries and determining layer thicknesses. From the processing point of view, electrical measurements are also undesirable. Electrical measurements are generally invasive, requiring a current to be passed through the material under test and requiring contacts to be made to the device or region of the material under investigation. This imposes practical difficulties such as the provision of space for such contacts, in turn limiting potential integration density, and certain processing environments. Such practical limitations may render the approach entirely impractical for some devices and impossible in typical environments such as plasmas or liquid chemical etchants.

The above-described electrical testing techniques are exemplified by Heiber et al. U.S. Pat. No. 4,562,089, which relies on resistance measurements, and DiStephano et al, U.S. Pat. No. 4,496,900, which applies an alternating voltage to a region and detects defects by observing a second harmonic of the applied voltage frequency in the current response arising from a voltage dependent conductivity.

It should also be noted that measurement of conductivity characteristics is an effect within the bulk of the material as well as being affected by the geometry of the conductive region and ambient conditions such as the presence of a plasma or liquid chemical etchant. Therefore, the technique disclosed by Heiber is unlikely to be usable in typical manufacturing process environments and is clearly inapplicable to monitoring the formation of insulator structures and problems such as the emitter opening technique described above, both of which involve monitoring of an area generally parallel to a surface rather than a current path through the bulk of a material. For instance, a current path could become discontinuous while substantial material remained unetched or could remain continuous while overetching was taking place in other portions of the area.

The most broadly applicable methods for real-time, in-situ analysis are based on optics. Optical methods can often be adapted to widely varying environmental conditions such as are found in chemical and reactive-ion etching, plasma-enhanced vapor deposition, etc. The purely optical approaches usually also have the advantage of being non-destructive and non-invasive. Moreover, the methods can generally yield lateral resolution (to approximately 1 $\mu$m) by focusing the relevant light beams or by means of imaging techniques.

For the most part optical methods for direct examination of surface structures involve a direct measurement of the reflectivity of the sample. Since optical radiation typically penetrates hundreds or thousands of atomic spacings (distances greater than 100 nm), it is difficult to obtain sensitivity on the level of one or a few atomic layers, which is the resolution desired for very precise control of processing. The sensitivity of reflectivity measurements can be enhanced in various ways, such as a judicious choice of the wavelength of the light used in the measurement. The most common refinement involves use of ellipsometry.

In this well-established technique, the polarization of the reflected light is analyzed. Since polarization can be measured with great accuracy with suitable instrumentation, the method can be highly sensitive to changes in surface properties and the thickness of material layers. The method has, however, significant practical limitations. The very small changes in polarization associated variation in film thickness by a few atomic layers can easily be masked by other effects arising from the bulk materials. These effects include the influence of slight temperature changes, the presence of strain, etc. Also, measurement in a manufacturing environment is difficult given the stringent requirements on geometric arrangement and geometric stability. Further the optical properties of windows, notably stress-induced birefringence, may significantly distort the measurements.

A different improved optical technique for determining layer thickness and the detection of boundaries is disclosed by Tien, U.S. Pat. No. 4,713,140. The technique disclosed by Tien relies upon the luminescence of direct band-gap semiconductors. This approach has a number of significant limitations, as well. First the method is suitable only for direct band-gap semiconductors, thereby excluding silicon, metals, and insulators, the materials of greatest importance currently in the electronics industry. Moreover, the emitted luminescence emerges as weak incoherent radiation. Therefore, while this technique can be applied to a small region, a lens is necessary for collection of the luminescent radiation which presents severe difficulties since the lens must be positioned closely to the irradiated region to collect the radiation of interest. Inaccuracies of lens positioning and sensitivity of the process to ambient radiation conditions could greatly distort the measurement results. The broad band luminescence radiation, typically at red regions of the spectrum at wavelengths greater than 800 nm, also presents particular difficulty in discriminating from background radiation (be it ambient light, plasma or thermal radiation) typically present or at least difficult to exclude from semiconductor manufacturing processes. The same problems are associated with the application of other techniques based on the emission of incoherent light, such as surface light scattering and Raman scattering.

Again, it should be noted that reflection observations, including ellipsometry, are bulk effects of the material and, although the effects are relatively strong, are inherently limited in accuracy due to the penetration of illuminating radiation into the bulk of the material and the thickness of that bulk which contributes to the response. This inherent limitation is also true of the technique of Tien, described above.

In more general terms, all of the optical techniques applied prior to the invention disclosed herein are difficult or impossible to adapt to yield sensitivity to surfaces or interfaces of materials with a sensitivity on the level of a single atomic layer or spacing, i.e., a fraction of a nanometer. This difficulty is inherent to the large penetration depth of the optical radiation, which implies that the effects of bulk materials will be far stronger than that of a thin layer comprising a surface or interface region. While sensitivity can sometimes be enhanced, as indicated above, this usually places severe restrictions on the choice of materials or on the instrumentation. Further, the measurements are generally subjected to potential errors from slight changes in the properties of the bulk materials, as may occur from strain, temperature or temperature gradients, and the like, as well as limitations on optical access and potential errors imposed due to the above-described imperfections of windows and other means of providing optical access to the material surface during processing.

In summary, a particular challenge has continued to exist in developing methods suitable for non-destructive, non-invasive measurements with a sensitivity approaching that of a single atomic layer.

Certain non-linear optical effects are known in fields heretofore unrelated to material processing, in general, or semiconductor device manufacture, in particular. For instance, the SHG effect consists of the production of light at twice the frequency of a pump beam. The process can be considered as the combining of two photons of energy E to produce a single photon of energy 2E, i.e., the production of light of twice the frequency (or half the wavelength) of the pump radiation. This effect can also be generalized to the combining of photons of different energies, corresponding to different frequencies, as well, as will be pointed out below (referred to as wave-mixing or sum- and difference-frequency generation). However, in the interest of clarity, the invention will be explained principally in terms of the second harmonic generation effect.

The existence of this effect was demonstrated shortly after the emergence of high-intensity laser radiation. The process is coherent and gives rise to collimated radiation when induced by a collimated pump beam. In suitable birefringent nonlinear crystals the SHG process can be quite efficient. As such, it is widely used to generate new frequencies of light in conjunction with high intensity lasers. The SHG process is, however, forbidden (to a very good approximation) within the bulk of many materials. These are all materials exhibiting a center of symmetry (inversion or centrosymmetric materials). Centrosymmetry materials include essentially all liquids and gases (because the random molecular positions therein appear similar, regardless of viewing direction) as well as essentially all elemental solids. Important examples of centrosymmetric materials for the electronics industry include silicon, germanium, most metals and silicides, and most insulators, such as (amorphous) silicon dioxide. For these materials, the SHG process is appreciable only at surfaces and interfaces where the inversion symmetry of the bulk materials is broken. SHG from these materials is then dominated by the contribution of roughly one atomic layer of the material at a surface or interface. This provides the SHG process with a sensitivity to surface and interface properties not found in other optical probes. Over the last few years the SHG process has been exploited in various scientific studies or the properties of surfaces and interfaces. Issues such as the question of the density and orientation of monolayers of adsorbed molecules have been examined. The technique has also been applied to elucidate the nature of ordering and electronic structure at surfaces under ultrahigh vacuum conditions.

A survey of scientific investigations in which this technique has been employed is provided by "Optical Second-Harmonic Generation from Semiconductor Surfaces" by T. F. Heinz et al., Published in Advances in Laser Science III, edited by A. C. Tam, J. L. Cole and W. C. Stwalley (American Institute of Physics, New York, 1988) p. 452, which is hereby incorporated by reference. Other publications which will be useful in understanding the SHG effect are: "Nonlinear Optics of Surfaces and Adsorbates" by T. F. Heinz, LBL-15255, Ph. D. Thesis, University of California, Berkeley, November, 1982; "Surface Studies by Second Harmonic Generation: The Adsorption of $O_2$, CO, and Sodium on the Rh (111) Surface" by H. W. K. Tom et al., Physical Review Letters, Vol. 52, No. 5, January 1984, American Physical Society, pp. 348–351; "Study of Si(111) Surfaces by Second Harmonic Generation: Reconstruction and Surface Phase Transformation" by T. F. Heinz et al. Physical Review Letters, Vol. 54, No. 1, January 1985, American Physical Society, pp. 63–66; "Study of Symmetry and Disordering of Si(111)-$7 \times 7$ Surfaces by Optical Second Harmonic Generation", by T. F. Heinz et al., J. Vac. Sci. Technol., B3(5), September/October 1985, American Vacuum Society, pp. 1467–1470; "Nonlinear Optical Study of Si Epitaxy", by T. F. Heinz et al., Mat. Res. Soc. Symp. Proc., Vol. 75, 1987, pp. 697–704, Materials Research Society; "Electronic Transitions at the $CaF_2/Si(111)$ Interface Probed by Resonant Three-Wave-Mixing Spectroscopy" by T. F. Heinz et al., Vol. 63, No. 6, August, 1989, pp. 644–647, American Physical Society; and "Surface Studies with Optical Second Harmonic Generation", by T. F. Heinz et al., Trends in Analytic Chemistry 8, pp. 235–242, 1989, all of which are also hereby fully incorporated by reference as is the information contained in the articles noted in the extensive bibliographies of these articles concerning the SHG effect. Thus it can be seen that the scientific aspects of the SHG process have been investigated extensively and the effect is deemed to be well-understood.

To summarize the SHG effect and the accuracy it provides in characterizing surfaces and boundaries near the surface of centrosymmetric materials such as silicon, metals, and insulators, it is evident that the SHG effect cannot occur efficiently as a bulk effect in these materials because of their symmetry properties. Therefore, regardless of the depth to which a beam of illuminating radiation may penetrate into the material, the SHG radiation will arise predominantly from the asymmetry present at a surface of the material or at a boundary therein. This efficient SHG will occur only in a layer with a thickness comparable to a single atomic layer. This effect is demonstrated in the results shown in FIG. 1a concerning the oxidation of a Si(111) surface under ultrahigh vacuum conditions. In this case, the oxidation reaction proceeds only to the formation of roughly one atomic layer of oxide (approximately 0.2 nm). The dramatic change in the SHG efficiency can be clearly observed.

A second example is shown in FIG. 1b, showing the SHG radiation in arbitrary units at varying depths of deposition of amorphous silicon on crystalline silicon. Thus, it can be seen that the SHG effect is relatively pronounced based on crystal structure and boundary depth without the existence of a chemical difference between the two materials on either side of the boundary.

A third example concerning an interface is given in FIG. 2. The data show the SHG efficiency for various pump laser frequencies (photon energies) for two different samples: a silicon surface covered by an oxide layer (the materials shown in FIG. 1a), indicated by circles 230 and a silicon surface covered by a calcium fluoride overlayer, indicated by dots 210 and fitted curve 220. In this case, the depth of the overlayer remains constant while the frequency of the irradiating frequency is changed. The marked differences in response can be attributed to the different nature of the interfaces in the two cases. The marked variation of SHG response with frequency in curve 220 also shows that the effect is frequency selective for a given material and also between materials. Note especially that lower curve 230, while appearing relatively flat, is clearly shown to be similarly measurable by FIG. 1a.

As is pointed out in the above incorporated articles, and shown in FIGS. 1a, 1b and 2, also represented therein, measurement of the SHG effect can yield a substantial amount of information concerning the nature of a surface or an interface. It provides the possibility for the development of a body of empirical data characterizing boundaries and surfaces with extremely high sensitivity. It should be stated that the SHG process is capable of distinguishing not only boundaries between materials with different chemical composition, but also between materials with the same chemical composition but differing crystal structures, as, for example, between amorphous or polycrystalline and crystalline silicon, as demonstrated in FIG. 1b. The SHG effect from a boundary beneath the top of the surface will generally exhibit a strong dependence on the distance of separation. On an atomic scale, this sensitivity will arise from the perturbed structural and electronic properties of the interface as its separation from the top surface decreases to a few atomic layers. On a larger length scale other factors will become relevant. These are the efficiency of propagation of the pump radiation at the fundamental frequency to the surface and the efficiency of escape of the second harmonic radiation through the overlayer. Further, interference effects arising from the contributions of the top of the surface and from the bottom boundary of the overlayer may enhance the sensitivity of the observed SHG signal on the separation. As a consequence of these effects, the amount of second-harmonic radiation generated will generally vary strongly as a boundary and the surface of the material approach or diverge from one another.

The use of the SHG process in centrosymmetric media has to date been restricted to scientific investigations of surface and interface properties. In these scientific investigations it is possible to exercise a high degree of control over the environment. For example, the amount of ambient illumination could be reduced if required. More significantly, the studies shown in FIGS. 1a, 1b and 2 were performed under highly idealized conditions, typically under ultrahigh vacuum. No bright source of radiation as would be present in a plasma in reactive ion etching or plasma enhanced chemical vapor deposition was present. Further, the surface temperatures of the samples were generally sufficiently low that they did not emit a significant amount of visible thermal radiation. Under realistic processing conditions, this may not be the case, since temperatures approaching 1000° C. are frequently encountered. It has also been found that the SHG effect in silicon grows markedly weaker with increased temperature, further compounding the problem. Given these difficulties the technique has not been considered to be even potentially suitable for measurements of etching, deposition, or other reactions under typical manufacturing conditions, notably in the presence of plasmas or high surface temperatures.

Consider then the above-noted operation of the emitter opening step in device processing. While the use of the SHG effect could potentially provide excellent results, the established approach would involve removing the wafer from the etching chamber to perform the measurements. Thus while the observation of the SHG effect could provide a resolution on the order of one atomic spacing, the realization of such accuracy in a practical device would require etching in steps of one atomic layer and checking after each step, thereby multiplying the complexity of the manufacturing process enormously.

In summary, the capability of the measurement technology and the present state of semiconductor manufacturing technology indicate a need for some arrangement whereby the full capabilities of both can be simultaneously realized. Specifically, while observation of the SHG effect can provide resolution of the position of a boundary to one atomic spacing and current techniques of material deposition and removal can ideally provide an equivalent accuracy, such capabilities cannot practically be implemented unless the SHG effect can be monitored during the course of such material deposition, removal or modification in order to observe and control it.

SUMMARY OF THE INVENTION

It is therefore an object of the present invention to provide an arrangement for monitoring, in situ, the progress of a material deposition, reaction, modification or removal process with an accuracy of one atomic spacing, or better.

It is another object of the invention to provide an optical observation technique for monitoring the SHG effect which is relatively insensitive to ambient radiation conditions, particularly those present during material processing, and, in particular, during processing in the presence of a plasma, such as in reactive ion etching.

It is a further object of the invention to provide an apparatus and methodology for reliably observing the SHG effect in centrosymmetric materials including semiconductors, metals and insulators including but not limited to silicon, germanium, silicon-germanium alloys, transition and noble metals, metal silicides, oxides and polymers during any process step used in the fabrication of electronic and opto-electronic devices and optical and magnetic storage media and apparatus.

It is yet another object of the invention to provide a system and methodology for increasing the signal to noise ratio in SHG observations.

It is yet a further object of the invention to provide a system and method for non-intrusive, in situ, real time process observation usable in adverse environments such as in a plasma or where optical access is limited.

In order to achieve the foregoing objects of the invention, a method is provided for processing a material including the steps of irradiating a portion of the surface of a material with coherent light having a first predetermined frequency, observing said surface of said material at a second predetermined frequency which is twice the first predetermined frequency, and controlling processing of the material.

In accordance with another aspect of the invention, apparatus is provided for monitoring the surface of a material during processing including means for causing optical second harmonic generation and means for detecting said optical second harmonic even in the presence of strong ambient radiation or a plasma.

In accordance with a further aspect of the invention, a method of monitoring the progress of material processing in provided including the steps of illuminating a material structure with radiation of a predetermined frequency, and observing changes in radiation from said material structure at another frequency different from said predetermined frequency.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Basically, the invention applies a non-linear optical effect occurring in a single atomic layer of a surface or interface to the field of material processing and, in particular to the fabrication of semiconductor devices. The preferred embodiment describes a method by which the second harmonic generation for the material being processed can be excited and detected, even in adverse ambient conditions typical of material processing operations. A preferred implementation of the invention uses a combination of techniques to render the weak SHG effect from a single atomic layer observable in a processing environment which may include strong ambient light or thermal radiation from plasmas or other sources. The techniques employed, according to the invention, improve signal to noise ratio by exploiting particular properties of the SHG effect. Specifically, as pointed out in detail in several of the above incorporated publications, the SHG effect occurs upon irradiation by a laser pulse and terminates essentially instantaneously after the laser pulse terminates. The SHG process is a coherent process and thus produces a reflected beam from a sample that will be collimated in space and narrow band in frequency whenever the material is excited by a collimated pump beam with a narrow frequency spectrum. Further, certain well-defined relations have been established between the polarization of the second harmonic field and that of the pump beam at the fundamental frequency which are determined by the symmetry of the radiating surface or interface. Therefore, the preferred embodiment of the invention incorporates a combination of temporal, spatial and spectral filtering. A further aspect of the invention improves discrimination of the desired signal from unpolarized background radiation by providing parallel detection channels to simultaneously monitor two orthogonal polarization components of the optical signal. The output then consists of the difference between the signals detected in the two channels and suppresses any contribution associated with the usual sources of unpolarized background radiation.

Figure 3:
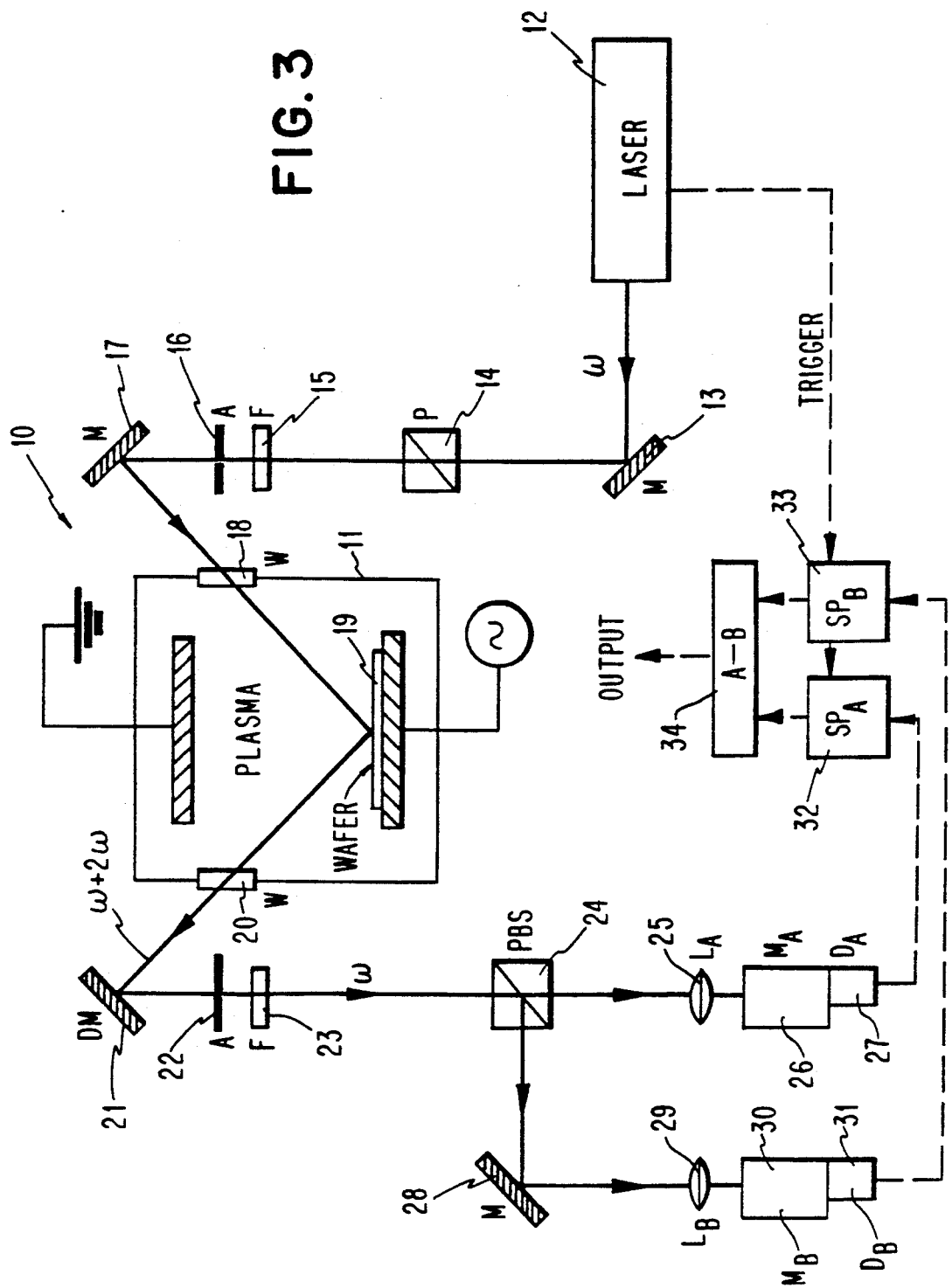
FIG. 3 is a schematic illustration of the overall organization of the invention according to a preferred embodiment thereof.

Referring now to the drawings, and more particularly to FIG. 3, there is shown a schematic illustration of the overall invention 10. The key elements of the system are a laser source 12 capable of producing high intensity pump pulses to irradiate the sample 19 in processing environment 11 at the fundamental frequency $\omega$. The pump radiation from the laser is polarized by polarizer 14, spectrally filtered by spectral filtering 15 and spatially filtered by aperture 16. The emitted second harmonic (SH) radiation is spectrally filtered by filter 23 and spatially filtered by aperture 22. In a preferred embodiment, the detection system is configured in two channels to permit simultaneous detection of the two orthogonal polarization components of the radiation at second harmonic frequency $2\omega$. The detection system comprises focussing optics 25 and 29, narrow band spectral filtering by monochromators 26 and 30 and detection of the resulting light by sensors 27 and 31. The signals from the sensors are processed by time-gated electronics 32 and 33 and comparator 34, which provides the final electrical output to be used for process monitoring.

As will be clear from FIG. 3, a laser 12 provides a short, intense pulse of collimated light. In the preferred embodiment laser 12 provides a pulse with a narrow spectral bandwidth centered at frequency $\omega$ and is typically of nanosecond duration, for example from the 1.06 $\mu m$ output of a Q-switched Nd:YAG laser. The invention can also be used with appropriate pump lasers having durations from the microsecond down to the femtosecond range. It should be further noted that the laser source may be tunable in frequency so that the frequency of operation best suited for the materials processing problem of interest may be exploited. The laser light is then, according to the invention, passed through polarizer 14 after reflection from mirror 13. Polarizer 14 provides a beam with a well-defined, adjustable polarization from an unpolarized laser. For a laser with polarized output, polarizer 14 provides additional control and may be used in conjunction with a polarization rotator to obtain an arbitrary polarization of the pump beam. Spectral filter 15 is designed to remove radiation outside the normal narrow bandwidth of the pump laser. Of particular importance, it removes any trace of light at the second-harmonic frequency $2\omega$ of the pump laser which would interfere with detection of the weak second-harmonic signal originating from the sample. This can be accomplished with a colored glass filter having a strong cut-off, as is found for suitable semiconductor-doped glasses. Subsequently, the pump laser beam is directed through aperture 16, which serves to remove any component of the pump laser beam that is not well collimated spatially. The pump beam is then reflected by mirror 17 and directed through window 18 onto the desired portion of the sample surface 19. This arrangement thus ensures that the pump beam is spatially collimated and has a spectrally narrow band at the fundamental frequency ω and that the radiation is in the form of a short pulse.

When the pump radiation strikes the sample 19, it will cause the SHG process to occur with an efficiency depending on the strength and polarization of the pump radiation reaching the sample. The strength and polarization of the resulting SHG radiation will be determined by the condition of the sample. The SHG generated by the sample will emerge as a coherent beam with a frequency just twice that of the pump laser and traveling along the same path as the reflected pump radiation. The combined pump radiation and second-harmonic radiation passes, according to the invention, out of the processing chamber through window 20. The combined radiation at the pump and second-harmonic frequencies, together with background radiation from the chamber, strikes mirror 21. In the preferred embodiment, this is a dichroic mirror designed to transmit most of the radiation at the fundamental frequency, but to reflect with high efficiency radiation at the second-harmonic frequency. This provides an initial stage of spectral filtering and removes high energy laser pulses from the optical path, thus avoiding any possible problems of damage of delicate instrumentation. The radiation is then spatially filtered by an aperture 22, which is adjusted to the minimum size required to permit the collimated second-harmonic beam to pass unimpeded. Filter 23 provides further spectral filtering and is designed to have extremely small transmission at the fundamental frequency of the laser, thereby excluding any remaining pump radiation. This filter may conveniently be taken as a colored glass filter or a bandpass interference filter.

In order to examine different regions of the sample, mirrors 17 and 21 may be rotated and translated. It is deemed desirable to provide a mechanism whereby these mirrors may be moved in synchronism to maintain overall optical alignment. In particular, the preferred embodiment of the instrument permits the beam to be directed to any desired region of the sample where fiducial or test structures may be prepared, as is discussed below. It should be further observed that the indicated optical arrangement may be supplemented by additional optical elements to provide for a tighter focus of the pump beam on the sample and a recollimation of the reflected second-harmonic radiation, if required. In this manner higher spatial resolution may be obtained. To retain the discrimination against isotropic background radiation in the detection system, it is desirable to use a collimated or nearly collimated pump laser beam. The size of this beam may advantageously be decreased below that produced by the pump laser by means of a beam condenser, e.g. a Galilean telescope, if desired.

In the preferred embodiment of the invention, a dual channel detection system is implemented. The light beams entering the two parallel detection channels are produced by the polarizing beam splitter 24. This device selectively transmits one polarization and reflects the orthogonal polarization, as indicated. As discussed here it is assumed that the p- and s- components of the light are separated. (These terms refer to light with a polarization vector parallel and perpendicular, respectively, to the plane of incidence of the light on the sample surface, in accordance with the usual usage.) It should be noted, however, that in certain situations it may be desirable to split the beam into other orthogonal polarization combinations. This may be accomplished by introducing a polarization rotator (generally together with a Babinet compensator) before passing through the polarizing beam splitter. Subsequent to the polarizing beam splitter, each channel consists of focussing optics 25 (29), a narrow band spectral filter such as a monochromator tuned to the second-harmonic frequency 2ω 26 (30), and an optical detector with high sensitivity to light at frequency 2ω 27 (31). This final stage of the optical train may also provide additional spatial filtering, as will, for example, occur in focussing the light beam on the entrance slit of a monochromator. Generally, a single monochromator is sufficient. In some instances, it may be desirable to use a double monochromator to suppress high levels of light at frequencies other than the desired frequency of the second-harmonic radiation 2ω. In other cases, an interference filter may be preferable for reasons of simplicity and cost. The band-width of the monochromator may be made as narrow as twice that of the pump laser. For example, if the pump laser has a frequency width Δω, the monochromator will provide maximal rejection of the background radiation if its bandwidth is just 2Δω. A choice of a larger bandwidth will introduce additional background light without increasing the second harmonic (SH) signal, while a narrower bandwidth will decrease the SH signal. The detector required in this invention is a high sensitivity photomultiplier or a similar device capable of producing an easily measurable electrical signal when absorbing a few photons of light. In implementing this invention it is deemed desirable to affix the photomultiplier or other photodetector directly to the monochromator, thus reducing exposure to ambient light.

The second-harmonic radiation arrives at the photomultiplier essentially in coincidence with the firing of the pump laser. (A timing difference of a few nanoseconds will arise from propagation delays.) The output of the photodetector is thus measured just slightly after the laser is fired. This can be accomplished most readily with a high-speed gated integrator 32 (33). The gated integrator is triggered electrically by the pump laser. In some cases, it is advantageous to trigger the gated electronics with a photodiode excited by the pump laser, so as to minimize electronic jitter in the measurement. Although high-speed gated integrators are shown in FIG. 3, the same purpose could also be accomplished by controlling the high voltage required for the photomultiplier or otherwise imposing at least one time window on its response.

Finally, the electrical outputs of the gated electronics in each channel are subtracted from one another in a comparator circuit 34. The differential signal from this unit is used to monitor materials processing of the sample 19 in vessel 11. It should be noted that optimal performance in this balancing scheme may be complicated by having a substantial variation in the absolute magnitude of the background radiation. For instance, such conditions may arise when the background radiation arises from an rf plasma where light production varies with time at rf frequency. In this instance, it is deemed desirable to synchronize the laser to a given part of the rf cycle. By choosing the appropriate part of the cycle, this may in itself reduce the background radiation and may, consequently, be considered a means of reducing interfering radiation independent of other steps implemented.

In order to utilize the invention described above, the following steps are deemed desirable to optimize the performance. The spatial, spectral, and temporal characteristics of the pump radiation are to be checked and optimized to obtain a spectrally narrow, well collimated pump beam in a short pulse. Further, the polarization of the pump radiation is to be selected in a manner discussed below. A further parameter that may be optimized for a given application is the frequency of the pump laser. As can be seen from the example in FIG. 2, the response of a surface or interface of a given material system will generally exhibit a strong spectral dependence. This can be exploited by selecting an appropriate laser wavelength for the materials processing step of interest. It should also be noted that the attenuation of the fundamental and second-harmonic radiation in reaching or leaving a buried boundary between materials will, in general, also be strongly influenced by the choice of frequencies for the measurement. This permits optimization of the sensitivity of the measurement to layer thickness. A further consideration relates to the reduction of background signals. The background radiation from the processing environment will also generally have a specific spectral dependence. For the case of thermal radiation, the background will be stronger at lower frequencies. This means that higher pump and harmonic frequencies may be advantageous. In the case of plasmas, well-defined narrow spectral features are frequently observed in the emission. It is clearly desirable to choose a frequency for the pump excitation in such a manner that the second-harmonic frequency is distinct from strong emission lines due to the process, material or other conditions not directly involved in the observation of the SHG effect.

In general, the spatial, spectral, and temporal filtering of the second-harmonic radiation should, as described above, be made as stringent as possible to minimize the influence of ambient radiation. None of the filters should, however, be so selective as to reject a significant portion of the coherent radiation produced by the SHG process of the sample. Practical limits of stability may limit the optimal choice of parameters. For example, small instabilities in the sample position or orientation may require less stringent application of spatial filtering.

The dual-channel detection system is to be adjusted in the following manner. In the absence of pump laser excitation, but in the presence of the usual background radiation from the processing environment, the gain of the electronics for the two channels is adjusted to give equal signals. The output of the comparator will then be zero. When the laser irradiation of the sample is initiated, second-harmonic light of the two orthogonal polarizations will be registered in each channel of the detection system. The polarization of the pump radiation at frequency $\omega$ should be chosen to yield substantially different signals for the two components of polarization of the second-harmonic radiation. Then a substantial output of the comparator will result. This may usually be accomplished, as discussed in the above-incorporated references, for example through the use of p-polarized pump radiation (pump radiation with the electric-field vector polarized parallel to the plane of incidence of light on the sample.) In the case of many possible surface symmetries of the sample, this excitation condition will lead solely to the production of p-polarized second-harmonic radiation, which will register in only one channel of the detection system. The other channel provides simply a reference of the strength of the unpolarized background radiation. Other possible combinations of input and output polarization suitable for particular problems may be ascertained either empirically or using the scientific principles developed in the above-incorporated references. Further, the choice of incident angle of the radiation on the sample can be optimized to obtain the most favorable conditions for the SHG measurements, such as the strongest correlations between the properties to be controlled in materials processing and the SHG signal, the strongest SHG signal, and so forth.

In view of the above, it is seen that the invention provides a mechanism for producing and observing the SHG effect in materials even in the presence of strong ambient radiation. This is accomplished by a combination of spatial, temporal, and spectral filtering and by means of a dual-channel differential measurement scheme based on two orthogonal polarizations of light. These approaches rely on the properties of the SHG effect discussed above and in the above-incorporated articles. Further, both the sensitivity and the utility of the SHG effect can be further enhanced based on the considerations given above dictating the choice of pump frequency and polarization. By means of this invention it is then possible to apply the SHG effect to perform measurements in environments where substantial amounts of masking radiation are present. For instance, in contrast to the laboratory environment, bright room lights can not be excluded in the manufacturing environment. The invention can also be applied in more difficult situations where the process itself produces bright light emission. Such processes involving significant production of light or other radiation potentially masking the SHG effect include reactive ion etching, enhanced plasma reactors including ECR and magnetron systems, ion beam implantation systems, and sputter and evaporative deposition systems. The invention may also be applied to systems involving liquid polishing and etching, such as chemical-mechanical polishers. As the above discussion demonstrates, the invention then provides the capability of non-invasive, real-time, in-situ monitoring of surfaces and boundaries during material processing in a wide range of environments and with a resolution as sensitive as one atomic layer.

As a specific example of an extremely adverse environment for real-time, in-situ measurements with high dimensional resolution, consider a silicon surface being etched in a $CF_4$ plasma. In this case, it has been found that an adequate signal to noise ratio for measurements can be obtained with a 10 nsec pump pulse with an energy of less than 10 mJ using the 1.06 $\mu$m wavelength of a Nd:YAG laser. These measurements can be performed using a laser with a repetition rate of 10 Hz. The second-harmonic signal may be observed with a detector having a solid angle limited to less than 0.05 steradians, a spectral bandwidth of less than 1 nm, together with a temporal resolution of less than 50 nsec in the gating electronics, all of which are presently possible.

Figure 1A:
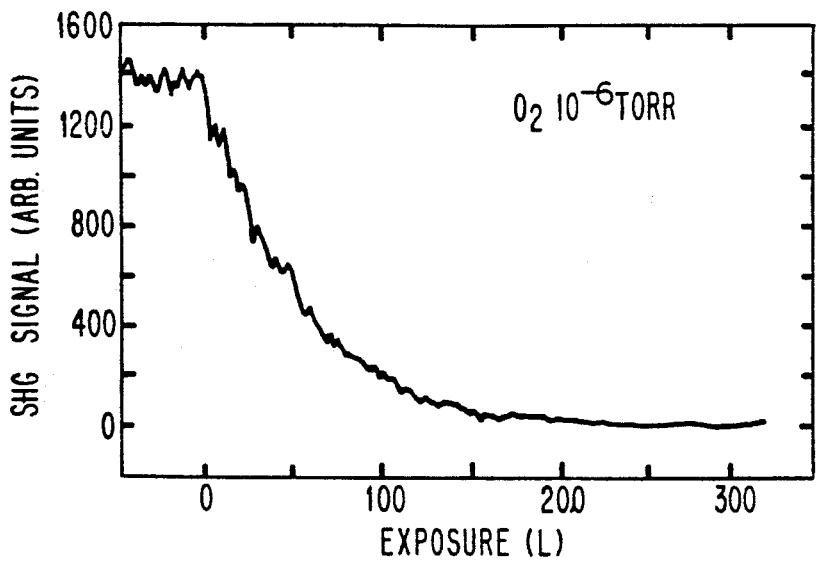
FIGS. 1a is a graph showing SHG intensity in arbitrary units of an increasing thickness of a surface layer of $SiO_2$ on a silicon surface during exposure to an oxygen-containing atmosphere.
Figure 1B:
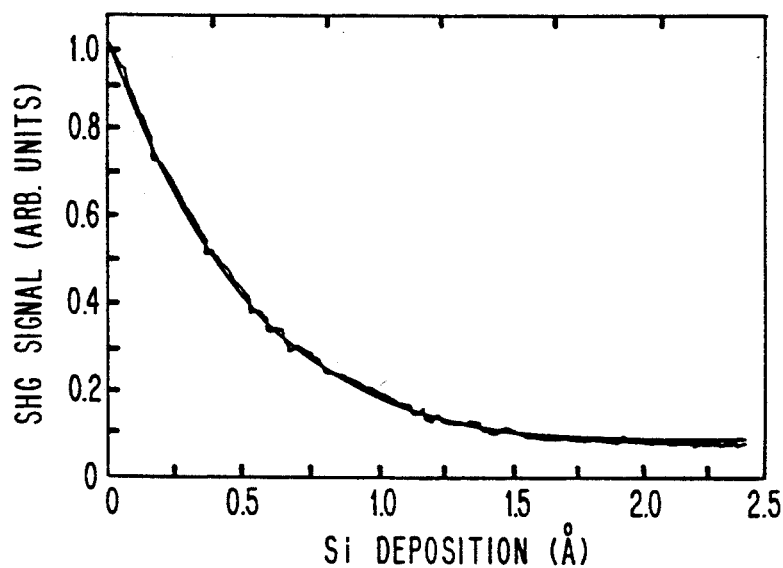
FIG. 1b is a graph showing SHG intensity in arbitrary units with increasing thickness of amorphous silicon deposition on crystalline silicon.
Figure 2:
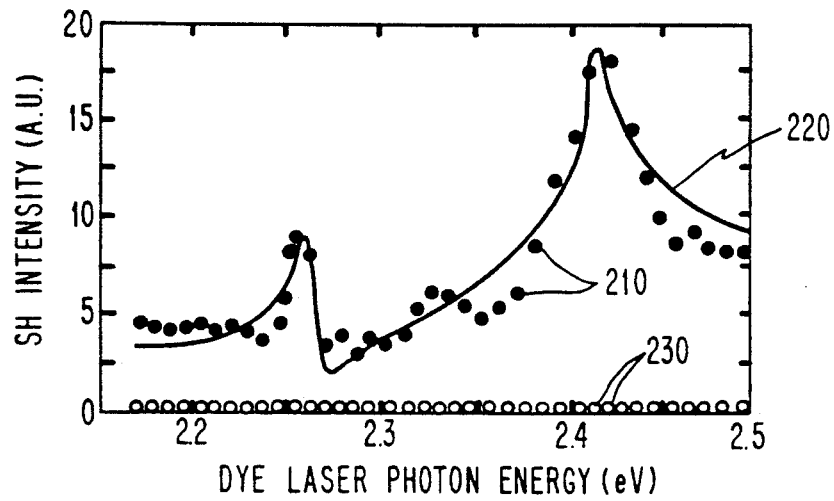
FIG. 2 shows relative strengths of SHG from a buried boundary between $CaF_2$ and silicon (111) and $SiO_2$ and silicon (111), respectively, over a range of illumination frequencies.

It should be noted, as in FIGS. 1a, 1b and 2, it is not necessary to quantify the SHG output radiation observed and that it is entirely sufficient for purposes of process control to observe characteristic changes to control material processing. Additional accuracy can be achieved by correlating the observed SHG measurements taken by in-situ observation during processing with measurements of the structural properties of the resulting material structure and layers thereof to obtain processing accuracies of a single or a very few atomic layers. By the same token, it is equally possible to use the invention to examine or monitor surface quality (e.g.

for undesired chemical reaction or contamination) before, after or during a processing step without removing the sample from the processing chamber or even interrupting the processing step. Based on such observations of surface quality, processing steps may be modified or other processing control imposed in the same manner as with material deposition, removal, reaction or modification, as described above.

The above example is deemed to be exemplary of an extremely adverse environment for application of the technique. It is to be understood that the invention is also applicable to cases where the circumstances for observing the SHG signal are less adverse. Then, simultaneous use of spatial, spectral, and temporal filtering and the dual-channel differential measurement scheme may not all be required. For instance, the time window could be extended, the field of view increased, or the bandwidth of the filters could be made wider within the scope of the invention while still yielding usable results. Further the differential detection scheme could also be eliminated and reliance placed upon the direct observation of the SHG effect made possible by the improved signal-to-noise ratio provided by the spatial temporal and/or spectral filtering according to the invention. Similarly, the steps described above for choosing a favorable frequency for the SHG process could be largely ignored in certain circumstances.

In application of this invention to manufacturing problems, the area of the sample probed may be that of a fiducial region. In this case, a part of the sample is prepared in a manner to facilitate control of the process on the rest of the sample. For example, the lateral length scale of the fiducial region might be made greater to simplify alignment and to permit the use of a larger probe beam. In some cases, a different sequence of layers of materials might be prepared for which the SHG effect was particularly favorable and which could be correlated with the desired behavior on the rest of the sample.

The apparatus and method of this invention can be applied to a wide range of processing environments used in the fabrication of devices with precise dimensional control by material deposition, removal, reaction, or other modification, as exemplified by the fabrication of electronic and opto-electronic devices and circuits. The invention can be utilized in processing environments with considerable ambient radiation from high temperatures, plasmas or other sources. It may be applied to centrosymmetric solids such as silicon, germanium, silicon/germanium alloys, most metals, insulators and polymers. It may be further utilized in the presence of liquids or gases, which also do not produce bulk second-harmonic radiation.

In view of the foregoing, it is seen that a method and apparatus has been provided which enables non-intrusive, in-situ, real time process observation usable in adverse environments such as in a plasma or where optical access is limited and on the basis of which materials processing can be controlled with high precision.

While the invention has been described in terms of a single preferred embodiment, those skilled in the art will recognize that the invention can be practiced with modification within the spirit an scope of the appended claims. In particular, it should be noted that the technique may be modified to allow the mixing of two or more incident laser beams of differing frequencies to produce a sum-frequency or difference-frequency signal, rather than a second-harmonic frequency produced by a single incident laser beam. This would provide further control of the frequency range accessible and could enhance the sensitivity of the technique in certain cases which will be evident in view of the foregoing disclosure.

Having thus described my invention, what I claim as new and desire to secure by Letters Patent is as follows:

1. A method of observing the surface of a material during processing of the material in the presence without control or limitation of ambient radiation produced by said processing, said method including the steps of
    directing coherent radiation of a first frequency toward said surface of said material,
    filtering said coherent radiation to pass substantially only radiation at said first frequency and to block substantially all radiation at a second frequency, said second frequency being twice said first frequency,
    illuminating said surface with said coherent radiation for an interval of time,
    observing radiation from said surface at said second frequency for a period of time beginning slightly subsequent to the beginning of said interval of time of said illuminating step, and
    controlling said processing in response to a change in radiation from said surface at said second frequency.

2. A method as recited in claim 1, wherein said ambient radiation varies cyclically with time and said observing step is performed during at least two time-separated intervals including the further step of
    synchronizing said illuminating step and said observing step to cyclical variation in said ambient radiation.

3. A method as recited in claim 1, wherein said step of filtering said coherent radiation further includes spatial filtering of said coherent radiation to remove substantially all uncollimated radiation.

4. A method as recited in claim 3, wherein said observing step includes
    filtering said radiation from said surface to pass substantially only radiation at said second frequency and to block substantially all radiation at said first frequency.

5. A method as recited in claim 4, wherein said observing step includes
    filtering said radiation from said surface to pass substantially only radiation at one or more polarization angles.

6. A method as recited in claim 3, wherein said observing step includes
    filtering said radiation from said surface to pass substantially only radiation at one or more polarization angles.

7. A method as recited in claim 1, wherein said observing step includes
    filtering said radiation from said surface to pass substantially only radiation at said second frequency and to block substantially all radiation at said first frequency.

8. A method as recited in claim 7, wherein said observing step includes
    filtering said radiation from said surface to pass substantially only radiation at one or more polarization angles.

9. A method as recited in claim 3, wherein said observing step includes spatial filtering to remove substantially all said radiation from said surface which is not collimated at a fixed angle to said surface.

10. A method as recited in claim 1, wherein said observing step includes
filtering said radiation from said surface to pass substantially only radiation at one or more polarization angles.

11. A method as recited in claim 1, wherein said observing step includes spatial filtering to remove substantially all said radiation from said surface which is not collimated at a fixed angle to said surface.

12. A method as recited in claim 11, wherein said fixed angle equals an incidence angle of said coherent radiation at said first frequency on said surface.

13. A method as recited in claim 1, wherein said ambient radiation varies cyclically with time and said observing step is performed during at least two time-separated intervals including the further step of
synchronizing said illuminating step and said observing step to cyclical variation in said ambient radiation.

14. A method of end-point detection in a process of etching a layer of material including the steps of
directing coherent radiation of a first frequency toward said surface of said material,
filtering said coherent radiation to pass substantially only radiation at said first frequency and to block substantially all radiation at a second frequency, said second frequency being twice said first frequency,
illuminating said surface with said coherent radiation for an interval of time,
observing radiation from said surface at said second frequency for a period of time beginning slightly subsequent to the beginning of said interval of time of said illuminating step, and
controlling said processing in response to a change in radiation from said surface at said second frequency.

15. A method as recited in claims 14, wherein said step of filtering said coherent radiation further includes spatial filtering of said coherent radiation to remove substantially all uncollimated radiation.

16. A method as recited in claim 15, wherein said observing step includes
filtering said radiation from said surface to pass substantially only radiation at one or more polarization angles.

17. A method as recited in claim 14, wherein said observing step includes
filtering said radiation from said surface to pass substantially only radiation at said second frequency and to block substantially all radiation at said first frequency.

18. A method as recited in claim 14, wherein said observing step includes
filtering said radiation from said surface to pass substantially only radiation at one or more polarization angles.

19. A method as recited in claim 14, wherein said ambient radiation varies cyclically with time and said observing step is performed during at least two time-separated intervals including the further step of
synchronizing said illuminating step and said observing step to cyclical variation in said ambient radiation.

20. A method as recited in claim 9, wherein said fixed angle equals an incidence angle of said coherent radiation at said first frequency on said surface.

* * * * *